United States Patent
Assaderaghi et al.

(10) Patent No.: US 6,352,882 B1
(45) Date of Patent: Mar. 5, 2002

(54) SILICON-ON-INSULATOR STRUCTURE FOR ELECTROSTATIC DISCHARGE PROTECTION AND IMPROVED HEAT DISSIPATION

(75) Inventors: Fariborz Assaderaghi, Mahopac; Louis Lu-Chen Hsu, Fishkill; Jack Allan Mandelman, Stormville, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/624,834

(22) Filed: Jul. 25, 2000

Related U.S. Application Data

(62) Division of application No. 08/822,440, filed on Mar. 21, 1997, now Pat. No. 6,121,661.
(60) Provisional application No. 60/033,043, filed on Dec. 11, 1996.

(51) Int. Cl.$^7$ .......................... H01L 21/00; H01L 21/84
(52) U.S. Cl. ...................................... 438/155; 438/156
(58) Field of Search .................................. 438/155, 164, 438/156, 158, 175, 174, 167, 149, 151, 152, 153, 154, 212, 192

(56) References Cited

U.S. PATENT DOCUMENTS

| | | | |
|---|---|---|---|
| 4,884,116 A | * 11/1989 | Shirai | 357/41 |
| 5,113,236 A | *  5/1992 | Arnold et al. | 257/347 |
| 5,618,745 A | *  4/1997 | Kita | 438/164 |

* cited by examiner

*Primary Examiner*—David Nelms
*Assistant Examiner*—Vickie Thao P Le
(74) *Attorney, Agent, or Firm*—Robert M. Trepp; Anne Vachon Dougherty

(57) ABSTRACT

Doped polysilicon plugs are formed in contact with MOSFET device regions and passing through the buried oxide region into the opposite type silicon substrate of an SOI structure. The polysilicon plugs are in contact with the sources and drains of the MOSFET devices to provide paths for dissipating positive and negative ESD stresses. In addition, the polysilicon plugs provide a thermal dissipation pathway for directing heat away from the circuitry, and provide a diode for the structure.

11 Claims, 5 Drawing Sheets

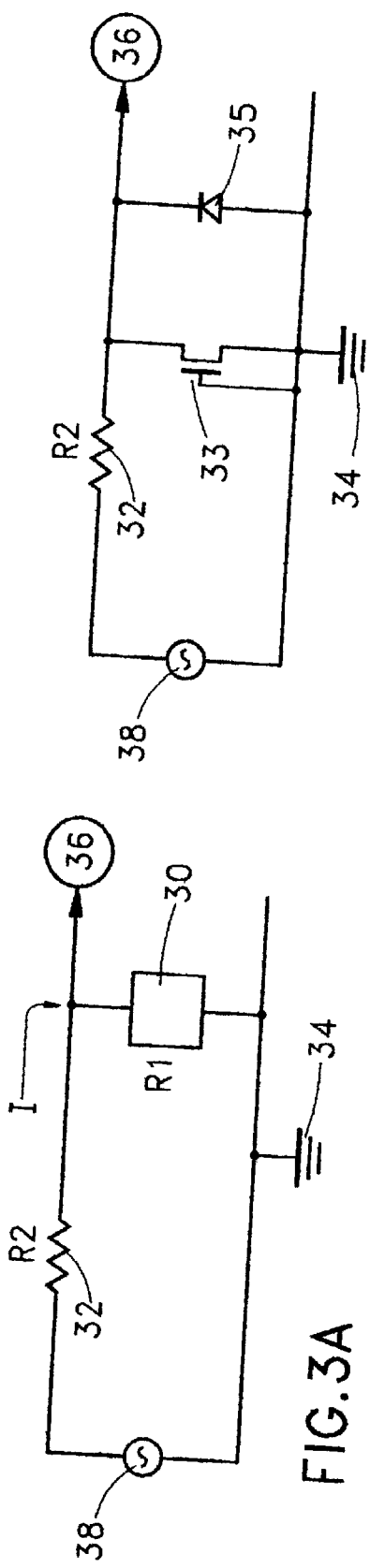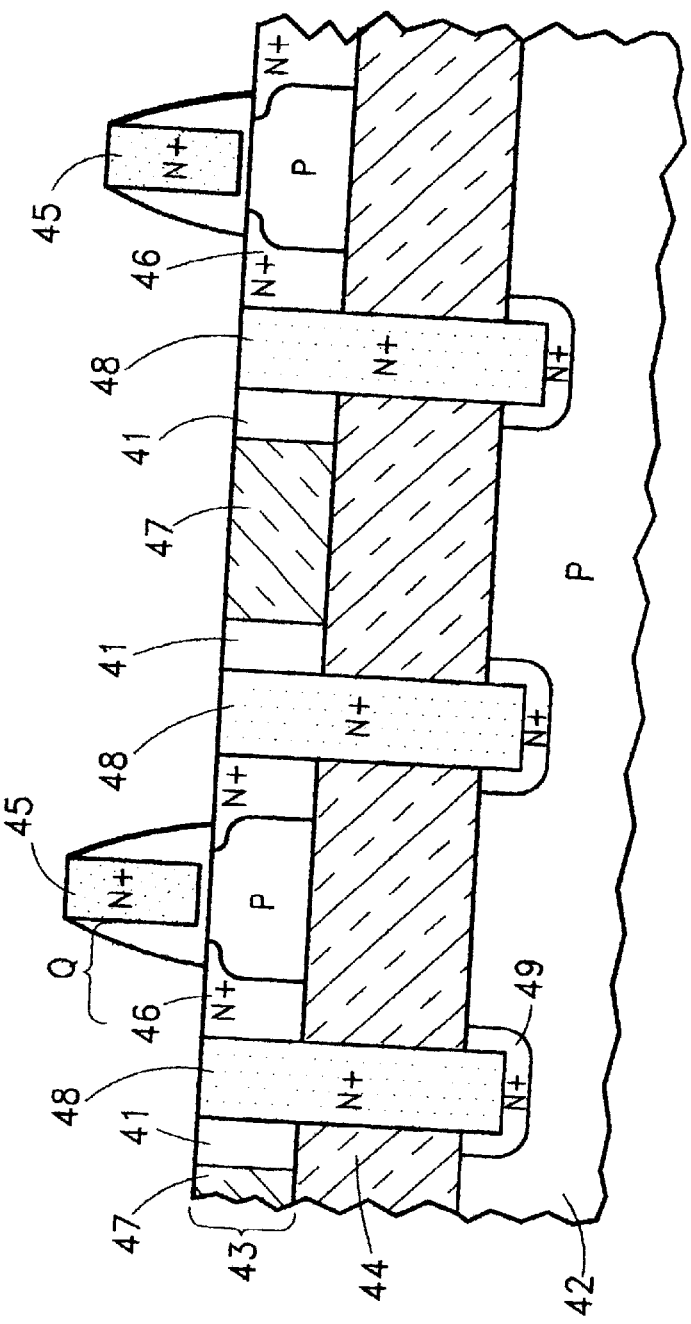

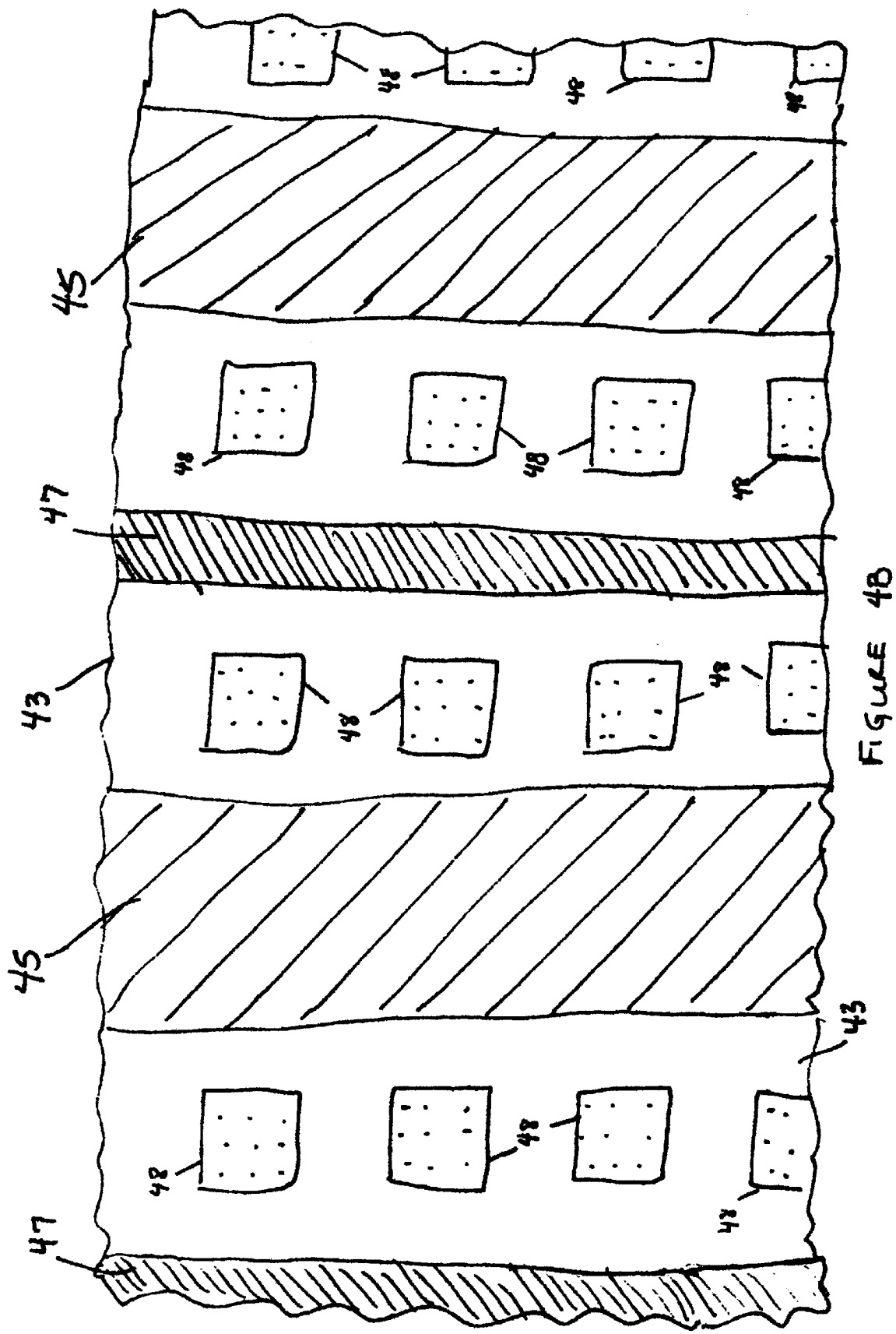

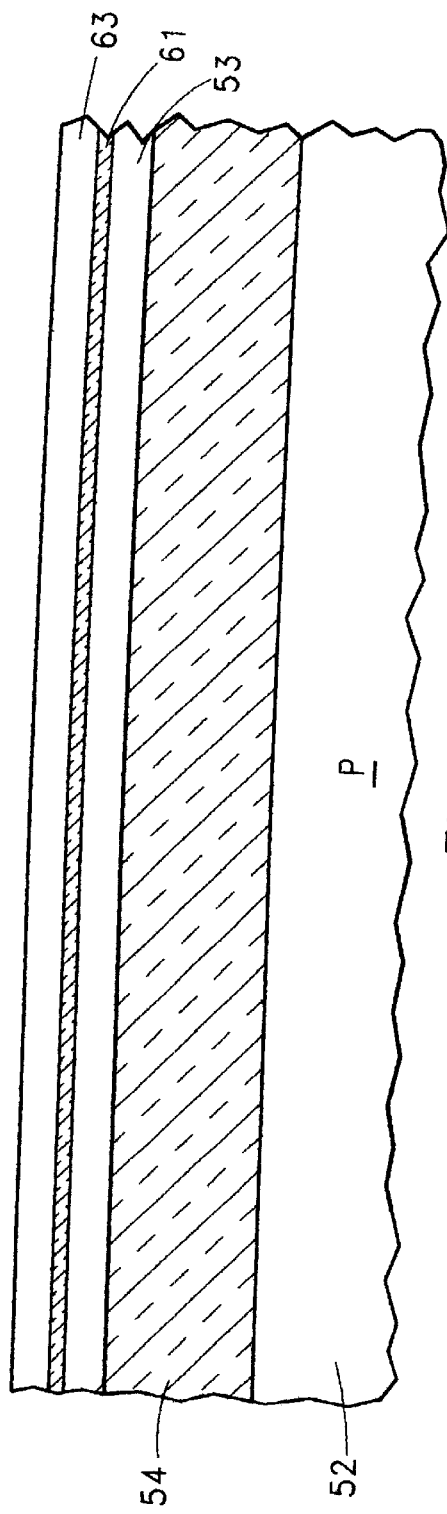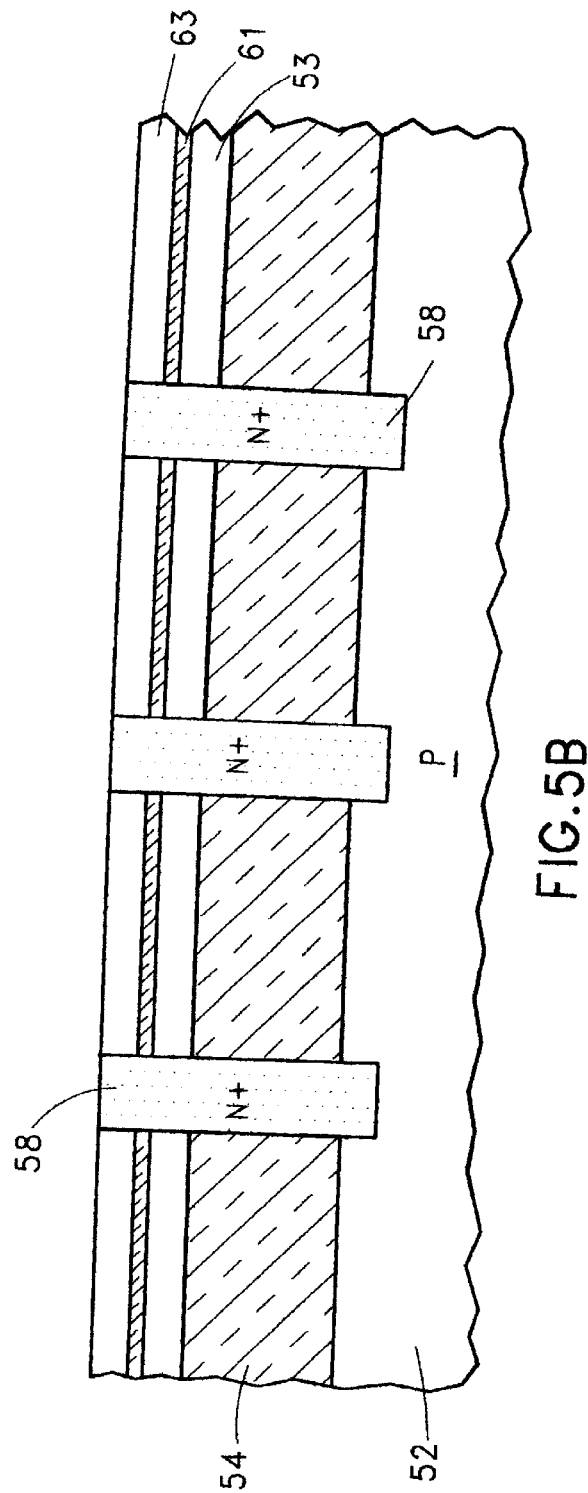

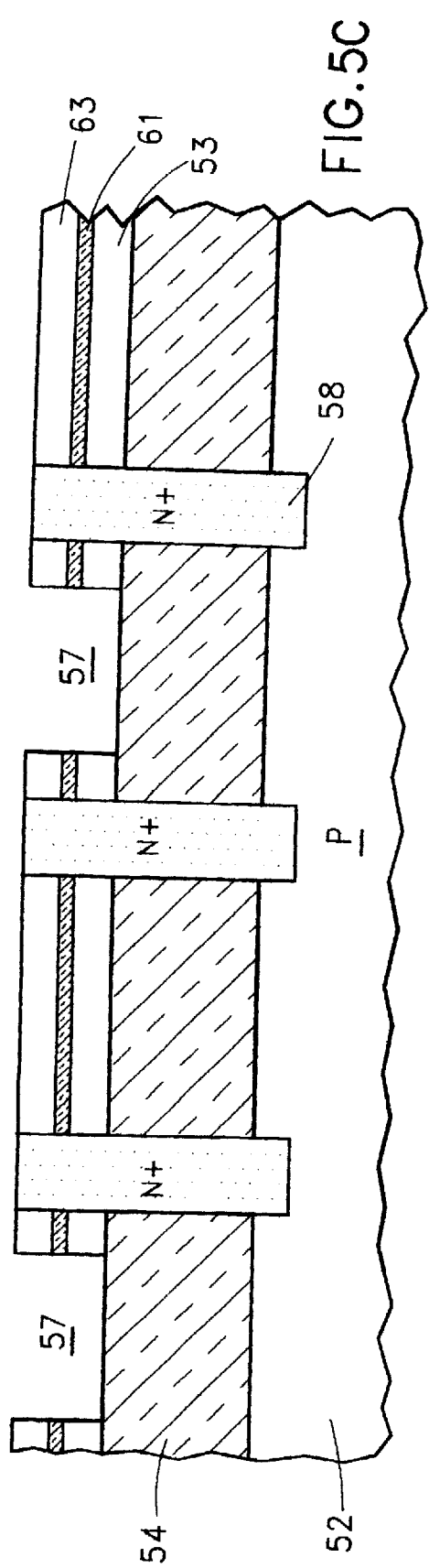
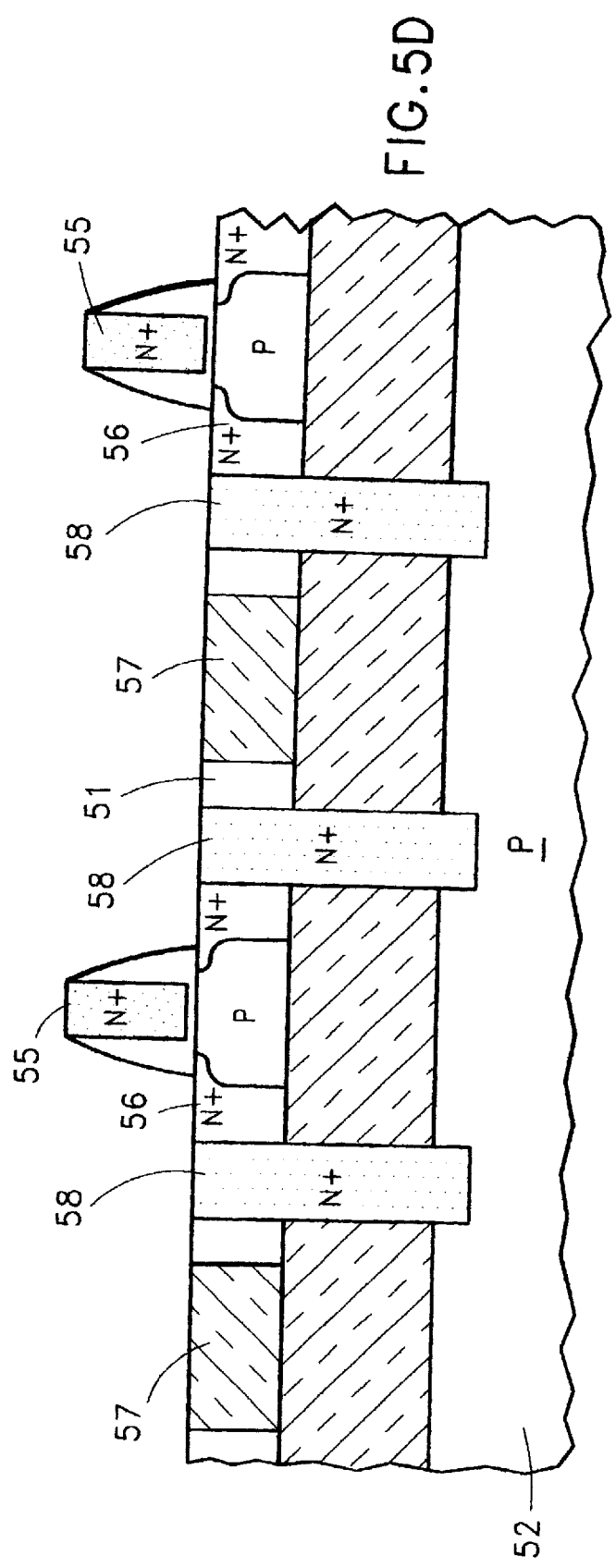

SILICON-ON-INSULATOR STRUCTURE FOR ELECTROSTATIC DISCHARGE PROTECTION AND IMPROVED HEAT DISSIPATION

CROSS-REFERENCE TO RELATED APPLICATION

This is a division of application Ser. No. 08/822,440, filed Mar. 21, 1997 now U.S. Pat. No. 6,121,661.

The present application claims priority to co-pending U.S. provisional application Ser. No. 60/033,043 filed Dec. 11, 1996.

FIELD OF THE INVENTION

This invention relates to silicon-on-insulator (SOI) CMOS technology, and more particularly to in-situ electrostatic discharge protection for SOI CMOS devices.

BACKGROUND OF THE INVENTION

Silicon-on-insulator (SOI) structures for CMOS devices have been developed as an alternative to the bulk silicon device technology for very large scale integration (VLSI) circuits. The SOI structures are preferable because the use of the buried oxide insulator layer provides several advantages including the absence of the reverse body effect, absence of latch-up, soft error immunity and elimination of the parasitic junction capacitance typically encountered in bulk silicon devices. Reduction of the parasitic capacitance allows for greater circuit density, operation at higher circuit speeds, and reduced power consumption. FIG. 1 illustrates a typical SOI CMOS structure wherein buried oxide (BOX) layer 14, generally about 0.1–0.5 microns in thickness, is provided in the substrate 12, which comprises 400–600 microns of silicon. For the sake of illustration, substrate 12 is shown as a p-type silicon substrate, with an MOSFET device formed at the surface. Clearly, the ensuing description of both the background and the novel structure and method will be applicable to devices formed in an n-type silicon substrate. The NMOSFET device, formed in the approximately 0.05 to 0.5 microns of crystalline silicon above the buried oxide layer, comprises polysilicon gate 15 and source and drain regions 16. Adjacent NMOSFET devices are both physically and electrically isolated from each other by shallow trench regions 17, comprised of an oxide region.

While SOI structures are advantageous for reduction of parasitic capacitance otherwise associated with bulk silicon CMOS devices, there are disadvantages to the isolation provided by the buried oxide layer. With the electrical isolation provided by the buried oxide, the devices cannot dissipate power or heat to the 400–600 micron silicon substrate, as efficiently as the bulk technology of the past had allowed. In bulk technology, the use of PN junction diodes, or NMOSFET devices with their gates grounded (operating in the so-called second breakdown regime) in parallel with diodes, provided electrostatic discharge (ESD) protection. ESD, primarily encountered through human contact or machine contact with the devices, and in shallow SOI structures gives rise to early failure of the devices, along with the possibilities of silicon melting, gate insulator rupture and metal melting due to the thermal build-up associated with the electrostatic discharge.

Solutions to the problem of ESD in bulk technology include the use of thick field oxide MOSFET's and large area PN diode junctions, neither of which is workable for SOI topographies. In an article entitled "ESD Reliability and Protection Schemes in SOI CMOS Output Buffers," published in *IEEE Transactions on Electron Devices*, Vol. 42, No. 10 (October 1995), pages 1816–1821, authors Mansun Chan, et al present and evaluate various ESD protection proposals for SOI structures. The article discussed the conventional grounded gate MOSFET built on the top superficial silicon layer, and optimization of such by alteration of gate-to-contact spacing, variation of the silicon film thickness, and adjustment of the effective channel width. With the foregoing modifications and optimizations, the device still does not provide the same level of protection as it would in bulk technology. The authors propose an alternative solution of providing a "through oxide buffer" for power dissipation.

The through oxide buffer ESD protection scheme of Chan, et al provides a path to contact the bulk substrate underlaying the buried oxide region, thereby emulating the power dissipation schemes used in bulk technology. FIG. 2 illustrates a device fabricated in accordance with the teachings of the Chan, et al article. The buried oxide layer 24 has been removed to allow ESD protection device formation in that area. One admitted shortcoming of the Chan, et al proposal is the height difference between the MOSFET and ESD protection device, which introduces problems in step coverage and residue removal during processing, and limits the device fabrication control for high performance circuits, given the limitations of current optical lithography tools (i.e., the depth of focus budget). Chan, et al specifically state that the proposed ESD protection scheme should not be considered for use for high performance circuits.

What is needed, therefore, is an ESD protection structure and method for fabrication of same which can be implemented for SOI technology without compromising the benefits of the SOI configuration.

It is therefore an objective of the present invention to provide an ESD protection structure for SOI devices.

It is additionally an objective of the invention to provide a method for creating ESD protection areas for SOI devices while maintaining a planar surface.

Yet another objective of the invention is to provide a method for incorporating ESD protection into SOI structures which is compatible with currently-used SOI fabrication processes.

SUMMARY OF THE INVENTION

These and other objectives are realized by the present invention wherein doped polysilicon plugs are formed passing through the buried oxide region and into the opposite type silicon substrate. The polysilicon plugs are in contact with the sources and drains of the CMOS devices to provide paths for dissipating positive and negative ESD stresses. In addition, the polysilicon plugs provide a thermal dissipation pathway for directing heat away from the circuitry, and provide a diode for such circuitry as would require same.

BRIEF DESCRIPTION OF THE DRAWINGS

The present invention will be detailed with specific reference to the appended drawings of which:

FIGS. 3A and 3B are circuit diagrams of ESD protection circuitry.

FIGS. 4A and 4B illustrate the inventive ESD structure incorporated into an SOI structure.

FIGS. 5A through 5D illustrate process steps for fabricating the present inventive structure.

DESCRIPTION OF THE PREFERRED EMBODIMENT

Figure 1:
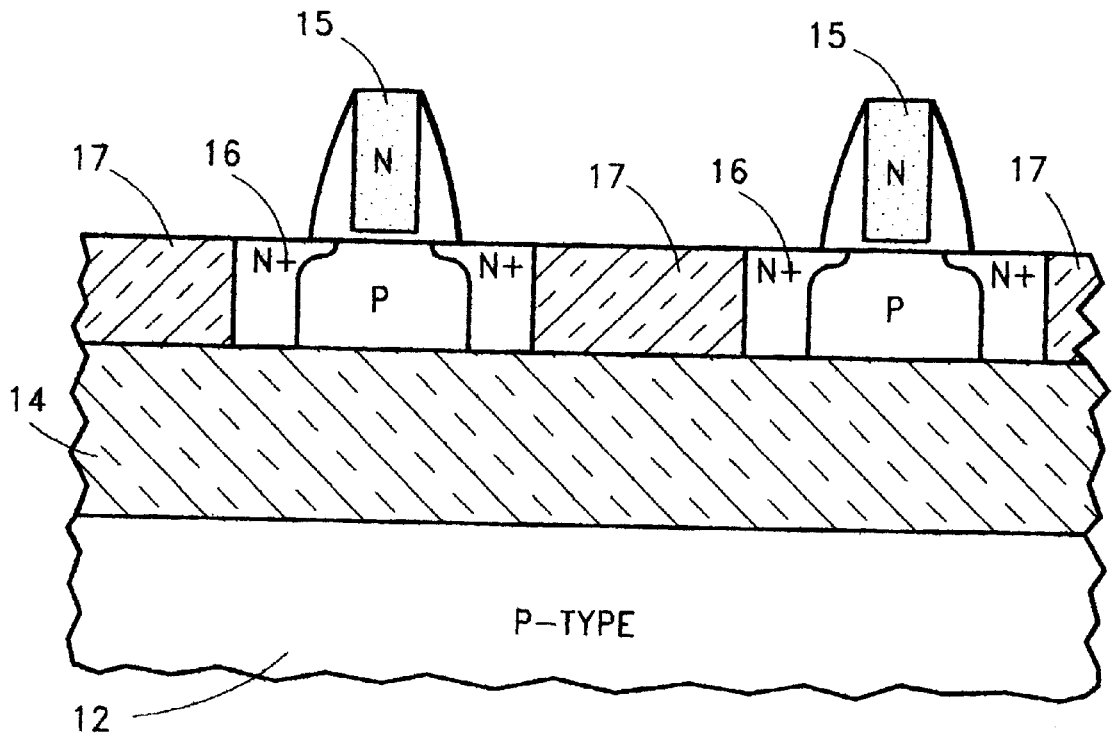
FIG. 1 provides a schematic illustration of a typical prior art SOI structure.
Figure 2:
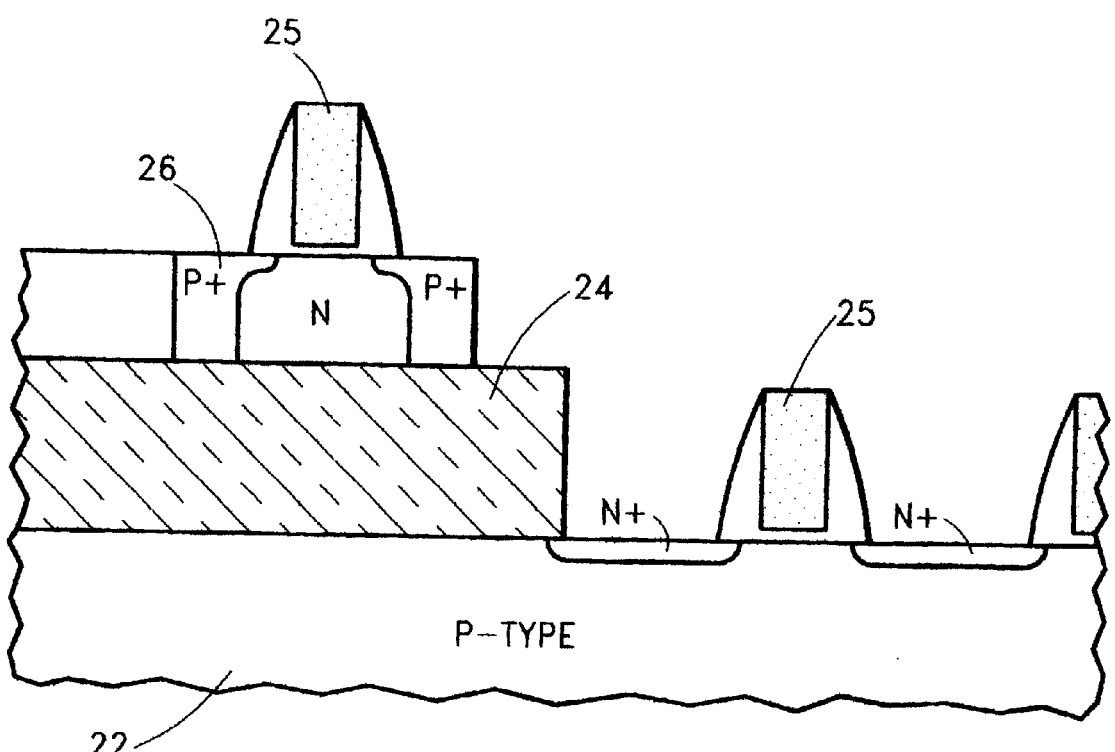
FIG. 2 illustrates a proposed ESD protection scheme provided in the prior art.

FIG. 1, as discussed above, illustrates one embodiment of circuitry fabricated using silicon-on-insulator (SOI) technology. The NMOSFET devices, comprised of gates 15 and source and drain regions 16 are isolated from the bulk silicon substrate 12 by the buried oxide layer 14 and are isolated from each other by the shallow trench regions 17. The features which provide advantages to the SOI configuration over bulk devices, such as the superior isolation from parasitic capacitance from the bulk silicon, also give rise to disadvantages, such as lack of an efficient conduction path for dissipation of power and heat. FIG. 2 illustrates the ESD protection circuitry proposed by Chan, et al in the aforementioned article, whereby an ESD protection device is formed in the substrate by removal of the buried oxide layer in the ESD protection device region. While the Chan, et al structure does provide for power dissipation, the sacrifice of planar topography is too great for practical implementation on all but the most basic circuits.

A preferred ESD protection circuit, as practiced for bulk technology, includes the circuit elements shown in FIG. 3. The power which must be dissipated by the ESD protection device is in the range of 1 watt (W), based upon simple human contact in the range of 2000 volts (V) and an ESD protection circuit 30, representatively having an $R_1$ value of 1 ohms ($\Omega$), in series with the circuit resistance 32 having an $R_2$ value of 2000$\Omega$. The 2000$\Omega$ resistance is representative of the effective resistance of the human body. Approximately 1 amp of current will flow from the 2000V across the approximately 2001$\Omega$ resistance, necessitating that the ESD protection device dissipate 1 W. "I" indicates the direction of flow of current for a positive ESD pulse through the ESD protection circuitry, which circuitry is provided between the voltage source 38 (e.g., the human body) and the MOSFET circuitry, not shown but represented by symbol 36. A preferred ESD protection device 30 comprises a MOSFET having its gate and source connected to ground and connected in parallel with a PN diode, as shown in FIG. 3B, or may be two diodes, both of which are well known in the bulk technology prior art. FIG. 3B details the preferred components of ESD protection circuitry, 30 of FIG. 3A, including MOSFET 33 in parallel with diode 35. The MOSFET will dissipate positive ESD pulses, while the diode will dissipate negative ESD pulses.

While prior art SOI solutions have proposed provision of a grounded transistor at the surface of an SOI structure to dissipate the power, the temperature encountered at the transistor is too great, given the relatively small volume of silicon available over the buried oxide layer. When a surface transistor must dissipate 1 W of power, the temperature at the device soars due to the poor heat conduction capability of the buried oxide with the adjacent buried oxide layer serving to trap the heat. Therefore, the surface transistor ESD protection device fails, with silicon melting, metal melting or gate oxide rupture being possible. As noted above, the Chan, et al solution, of forming the ESD MOSFET through an opening in the buried oxide to contact the underlying substrate, provides for both power and high temperature dissipation, but does not yield a device topography which is suitable for most high performance circuitry.

What is proposed by the present inventors is provision of a doped polysilicon filled trench or plug adjacent to the MOSFET device reaching through the buried oxide layer to provide a heat path through to the underlying substrate and additionally acting as a PN diode. FIG. 4A illustrates the present inventive structure including a buried oxide layer 44 formed in substrate 42, with silicon layer 43 formed above the buried oxide layer. For purposes of illustration, the structure is formed in a p-type silicon substrate. One having skill in the relevant art will clearly understand that the structure could be formed in an n-type silicon substrate with all attendant materials adjusted to arrive at a structure equivalent to the one illustrated. The silicon layer 43 and the buried oxide layer 44 have been opened in areas immediately adjacent the device sites to form trenches 48 which are filled with an n+ polysilicon to form polysilicon plugs. The polysilicon fill reaches to the surface of the silicon layer 43, which allows the present inventive structure to provide the same degree of planarity as has been encountered in SOI technology in the past.

Shallow trench isolation regions 47 are formed in the silicon layer 43, with areas 41 of the silicon layer alternately interleaved with the shallow trench isolation regions and the devices with adjacent polysilicon plugs. For the illustrated structures, the shallow trench isolation regions are not necessary for electrical isolation, but may help to minimize temperature increase in the MOSFET's by isolating them. The MOSFET devices are formed in accordance with the known technology, having polysilicon gate 45 and n+ source and drain regions 46 in contact with the n+ polysilicon plugs. The distance between the polysilicon gate 45 and the n+ polysilicon plugs is kept at a minimum to allow for optimal usage of the topography; however, a minimum distance Q must be maintained in order to protect the MOSFET source and drain regions and deep junctions, 46, from out-diffusion of dopants from the polysilicon in the plug, which out-diffusion could alter the electrical characteristics of the device. That minimum distance should be approximately the overlay tolerance (i.e., one half of a lithographic image) unless a self-aligned scheme can be used. Area 49 at the base of the plug illustrates a region of out-diffusion into the silicon substrate, which clearly will not affect the operation or effectiveness of the MOSFET device or of the ESD protection, and actually improves the reverse breakdown of the diode.

As stated as an objective of the invention, the illustrated structure provides the ESD and thermal protection without altering the topology of the SOI structure. The polysilicon plugs 48 provide a pathway for dissipation of power through the substrate underlying the buried oxide layer, provide the same pathway for heat dissipation, and provide an additional PN junction diode with minimal sacrifice of valuable area. The preferred ESD protection combination of transistor and diode is therefore realized by the present invention. The heat conduction path provided by the polysilicon plug is particularly advantageous for large devices, including large transistors, voltage regulators, I/O buffers and clock drivers. The advantage of the inventive structure to the listed devices is that the normal self-heating which is encountered during operation of these devices is significantly reduced, with the heat being channeled away from the device via the polysilicon. While the provision of a plug to the substrate does re-introduce some degree of junction capacitance to the SOI structure, the amount of capacitance is relatively low, so as not to affect overall device performance, and is, in fact, beneficial in some instances, e.g., for reducing the power supply noise.

FIG. 4B provides an overhead view of the inventive structure wherein each of a plurality of transistors, having gates 45 formed at the upper surface of the silicon top layer, 43, are connected in parallel to a plurality of diodes, 48.

The process for fabricating the inventive SOI structure is schematically illustrated in FIGS. 5A through 5D. FIG. 5A shows the base structure including the substrate 52, buried oxide layer 54 and crystalline silicon layer 53. Layers 61 and 63 comprise oxide and nitride layers, respectively, which are used for creating etching masks for the SOI structure. As shown in FIG. 5B, channels have been opened up through the mask nitride and oxide layers and the underlying crystalline silicon layer 53, the buried oxide layer 54 and the p-type silicon substrate 52 have been etched to form trenches 58, with the trenches being filled with an n+ polysilicon to form the uninsulated polysilicon plugs. The etching processes will be consistent with the prior art etching processes, using known timed or end point detection (e.g., with monitoring of gaseous residue) schemes to determine which materials are being etched and to what depth. Prior to polysilicon filling to form the plugs, an optional cleaning step can be conducted, including a short sacrificial oxidation and etching process to remove interface states and mechanical stresses in the trench. Out-diffusion of the polysilicon, by heating, can be conducted by a separate process step to form the junction at the bottom of the plug; however, such out-diffusion will occur during the heating cycles typically encountered during the ensuing device fabrication. Polysilicon filling of the plugs will be followed by a polishing step to polish the polysilicon back to a point at which it is level with the nitride layer. Chemical-mechanical polishing, conducted at a relatively slow rate, can be used to remove the excess polysilicon using the nitride as the polish stop layer.

After the plugs have been formed and filled, standard device processing steps can be followed to complete the structure. Assuming that the nitride and oxide layers are intact from the previous process steps, those layers are patterned, for example by reactive ion etching, to define the shallow trench isolation regions. An additional difference between the prior art SOI structure and the present inventive structure is the fact that the shallow trench isolation regions are no longer adjacent to the source and drain regions of the MOSFET's. Rather, the polysilicon plugs are in contact with the device regions to allow for power and heat dissipation from the devices. Areas 51 of the crystalline silicon layer 53 are interleaved with the plug-device-plug regions and the shallow trench isolation regions in order to optimize the device heating isolation.

FIG. 5C illustrates the shallow trench isolation regions 57 formed in the crystalline silicon. Alternate areas of the silicon between the polysilicon plugs, which have been designated for device real estate and the polysilicon plug regions are masked during the trench definition processes of opening a window in the nitride/oxide mask, forming a trench and filling the trench to define the isolation region. Next, the nitride/oxide mask is removed and the device formation is conducted in accordance with known processing techniques, to arrive at the structure of FIG. 5D.

While the present invention has been described with reference to several preferred materials and structures, modifications as will occur to one having skill in the art cannot be made without departing from the spirit and scope of the invention as set forth in the appended claims.

Having thus described our invention, what we claim as new and desire to secure by Letters Patent is:

1. A method for providing electrostatic discharge protection for integrated circuit devices formed in the top surface of a substrate comprising a silicon top layer having an upper surface, a buried oxide layer and a bulk silicon region, whereby said buried oxide layer is interposed between said silicon top layer and said bulk silicon region, comprising the steps of:
   providing trenches in said substrate adjacent to said integrated circuit devices; and
   filling said trenches with polysilicon extending from said upper surface of said silicon top layer into said bulk silicon region whereby said Polysilicon is in thermal and electrical contact with said integrated circuit devices and the bulk silicon.

2. A method for providing electrostatic discharge protection for integrated circuit devices formed in the top surface of a substrate comprising a silicon top layer having an upper surface, a buried oxide layer and a bulk silicon region, whereby said buried oxide layer is interposed between said silicon top layer and said bulk silicon region, comprising the steps of:
   providing diodes in said substrate adjacent to said integrated circuit devices; and
   electrically connecting said diodes with said integrated circuit devices and with said bulk silicon region.

3. The method of claim 2 wherein said providing diodes comprises the steps of:
   providing trenches in said substrate adjacent to said integrated circuit devices; and
   filling said trenches with polysilicon extending from said upper surface of said silicon top layer into said bulk silicon region and electrically contacting the polysilicon with the integrated circuit devices and with the bulk silicon.

4. The method of claim 3, further comprising the steps of:
   exposing said trenches to an oxidizing atmosphere to oxidize silicon along the walls of said trenches; and
   etching said trenches to remove oxidized silicon along said walls.

5. A method for providing integrated circuit devices having electrostatic discharge protection in a substrate comprising a silicon top layer having an upper surface, a buried oxide layer and a bulk silicon region, whereby said buried oxide layer is interposed between said silicon top layer and said bulk silicon region, comprising the steps of:
   providing an etching mask on said upper surface;
   forming trenches in said substrate through said mask, said trenches extending from said upper surface, through said buried oxide layer and into said bulk silicon region;
   filling said trenches with polysilicon whereby said polysilicon is in electrical contact with said bulk silicon region;
   forming integrated circuit devices in said silicon top layer between said trenches; and
   electrically connecting said integrated circuit devices to said polysilicon in said trenches.

6. The method of claim 3 wherein said providing an etching mask comprises the steps of:
   depositing an oxide layer on said top surface;
   depositing a nitride layer on said oxide layer; and
   patterning said nitride and said oxide layers.

7. The method of claim 5 wherein said forming said integrated circuit devices comprises the steps of:
   forming source and drain regions in said silicon top layer adjacent to said trenches; and
   providing a polysilicon gate at said top surface, aligned to said source and drain regions.

8. The method of claim 5, further comprising the steps of:

exposing said trenches to an oxidizing atmosphere to oxidize silicon along the walls of said trenches; and etching said trenches to remove oxidized silicon along said walls.

9. The method of claim 1 further comprising forming at least one shallow trench oxide region in said silicon layer adjacent to, but not contacting, said polysilicon-filled trenches.

10. The method of claim 2 further comprising forming at least one shallow trench oxide region in said silicon layer adjacent to, but not contacting, said polysilicon-filled trenches.

11. The method of claim 5 further comprising forming at least one shallow trench oxide region in said silicon layer adjacent to, but not contacting, said polysilicon-filled trenches.

* * * * *